United States Patent
Ohse et al.

(10) Patent No.: US 10,439,060 B2
(45) Date of Patent: Oct. 8, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Naoyuki Ohse, Nagano (JP); Shinsuke Harada, Ibaraki (JP); Makoto Utsumi, Nagano (JP); Yasuhiko Oonishi, Nagano (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/993,281

(22) Filed: May 30, 2018

(65) Prior Publication Data

US 2018/0366574 A1 Dec. 20, 2018

(30) Foreign Application Priority Data

Jun. 16, 2017 (JP) .................. 2017-118881

(51) Int. Cl.
*H01L 29/78* (2006.01)
*H01L 29/06* (2006.01)
*H01L 29/10* (2006.01)
*H01L 29/66* (2006.01)
*H01L 29/16* (2006.01)

(52) U.S. Cl.
CPC ...... *H01L 29/7811* (2013.01); *H01L 29/0626* (2013.01); *H01L 29/1095* (2013.01); *H01L 29/66068* (2013.01); *H01L 29/7813* (2013.01); *H01L 29/1608* (2013.01)

(58) Field of Classification Search
CPC ... H01L 29/78; H01L 29/7811; H01L 29/7813
USPC .......................................... 257/77
See application file for complete search history.

(56) References Cited

U.S. PATENT DOCUMENTS

| | | | |
|---|---|---|---|
| 6,180,958 B1 | 1/2001 | Cooper, Jr. | |
| 10,008,592 B1 * | 6/2018 | Kojima | ............... H01L 29/0615 |
| 2011/0024831 A1 | 2/2011 | Nakano | |
| 2012/0037920 A1 | 2/2012 | Treu et al. | |
| 2017/0141222 A1 * | 5/2017 | Harada | ............... H01L 29/1095 |
| 2018/0138309 A1 * | 5/2018 | Kinoshita | ........... H01L 29/7811 |

FOREIGN PATENT DOCUMENTS

| | | |
|---|---|---|
| JP | 2009-260253 A | 11/2009 |
| JP | 5539931 B2 | 7/2014 |

* cited by examiner

*Primary Examiner* — Fazli Erdem
(74) *Attorney, Agent, or Firm* — Rabin & Berdo, P.C.

(57) ABSTRACT

A semiconductor device includes an n-type silicon carbide epitaxial layer on a front surface of an $n^+$-type silicon carbide substrate. A first $p^+$-type base region is provided in the n-type silicon carbide epitaxial layer and a breakdown voltage structure region is provided in an outer periphery of an active region through which a main current flows. A distance between the first $p^+$-type base region and a front surface of the $n^+$-type silicon carbide substrate is smaller than a distance between the breakdown voltage structure region and the front surface of the $n^+$-type silicon carbide substrate.

4 Claims, 11 Drawing Sheets

FIG.13

| | EXAMPLE | FIRST COMPARISON EXAMPLE | SECOND COMPARISON EXAMPLE |
|---|---|---|---|
| BREAKDOWN VOLTAGE | 1500V | 1700V | 1700V |

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-118881, filed on Jun. 16, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, vertical metal oxide semiconductor field effect transistors (MOSFETs) having a trench structure are fabricated (manufactured) to reduce element ON resistance in power semiconductor elements. In vertical MOSFETs, the cell density per unit area may be increased to a greater extent with a trench structure in which a channel is formed vertically with respect to the substrate surface as compared to a planar structure in which a channel is formed parallel to the substrate surface. As a result, the current density per unit are may be increased, which is advantageous in terms of cost.

However, when a trench structure is formed in a vertical MOSFET, to form a channel in a vertical direction, a structure is adopted in which a gate insulating film covers inner trench walls entirely. A portion of the gate insulating film at a bottom of the trench is near a drain electrode whereby a high electric field is likely to be applied to the portion of gate insulating film at the bottom of the trench. In particular, with wide bandgap semiconductors (semiconductors having a bandgap wider than that of silicon (Si), e.g., silicon carbide (SiC)), since ultra-high voltage elements are produced, the gate insulating film at the bottom of the trench is adversely affected, causing reliability to decrease.

As a method to resolve such problems, a structure has been proposed in which to mitigate electric field strength at the bottom of the trench, a p-type region is formed in contact with a p-type base region and reaches a position deeper than a bottom of a trench, and a pn junction is formed at a position deeper than the bottom of the trench (for example, refer to Japanese Patent No. 5539931). A further structure has been proposed in which a p-type region is formed at a bottom of a trench (for example, refer to U.S. Pat. No. 6,180,958). Another structure has been proposed combining a structure in which a p-type region is formed at the bottom of the trench and a structure in which a p-type region is formed to be in contact with a p-type base region and reach a position deeper than a bottom of a trench, and a pn junction is formed at a position deeper than the bottom of the trench (for example, refer to Japanese Laid-Open Patent Publication No. 2009-260253).

SUMMARY OF THE INVENTION

According to an embodiment of the present invention, a semiconductor device includes a wide bandgap semiconductor substrate of a first conductivity type and containing a semiconductor material having a bandgap wider than that of silicon; a first wide bandgap semiconductor layer of the first conductivity type provided on a front surface of the wide bandgap semiconductor substrate, the first wide bandgap semiconductor layer containing the semiconductor material having a bandgap wider than that of silicon, an impurity concentration of the first wide bandgap semiconductor layer being lower than an impurity concentration of the wide bandgap semiconductor substrate; a first base region of a second conductivity type selectively provided in a surface layer on a first side of the first wide bandgap semiconductor layer opposite a second side of the first wide bandgap semiconductor layer facing the wide bandgap semiconductor substrate; a second base region of the second conductivity type selectively provided in the first wide bandgap semiconductor layer; a second wide bandgap semiconductor layer of the second conductivity type provided on a surface on the first side of the first wide bandgap semiconductor layer, the second wide bandgap semiconductor layer containing the semiconductor material having a bandgap wider than that of silicon; a source region of the first conductivity type selectively provided in the second wide bandgap semiconductor layer; a trench in contact with the source region, and penetrating the second wide bandgap semiconductor layer and reaching the first wide bandgap semiconductor layer; a gate electrode provided in the trench, via a gate insulating film; an interlayer insulating film provided on the gate electrode; a source electrode in contact with the source region and the second wide bandgap semiconductor layer; a drain electrode provided on a rear surface of the wide bandgap semiconductor substrate; an active region through which a main current flows between the source electrode and the drain electrode; and a breakdown voltage structure region of the second conductivity type provided in an outer periphery of the active region. A distance between the first base region and the front surface of the wide bandgap semiconductor substrate is smaller than a distance between the breakdown voltage structure region and the front surface of the wide bandgap semiconductor substrate.

In the embodiment, a part of the breakdown voltage structure region is provided on the first base region.

In the embodiment, an impurity concentration of the breakdown voltage structure region is at least $1.0\times10^{17}/cm^3$. The breakdown voltage structure region is provided to an outer position at least 5.0 μm beyond that of the first base region.

In the embodiment, the semiconductor material having a bandgap wider than that of silicon is silicon carbide.

According to another embodiment of the present invention, a method of manufacturing a semiconductor device, includes forming a first wide bandgap semiconductor layer of a first conductivity type on a front surface of a wide bandgap semiconductor substrate of the first conductivity type and containing a semiconductor material having a bandgap wider than that of silicon, the first wide bandgap semiconductor layer containing the semiconductor material having a bandgap wider than that of silicon, an impurity concentration of the first wide bandgap semiconductor layer being lower than that of wide bandgap semiconductor substrate; selectively forming a first base region of a second conductivity type in a surface layer on a first side of the first wide bandgap semiconductor layer opposite a second side of the first wide bandgap semiconductor layer facing the wide bandgap semiconductor substrate; selectively forming a second base region of the second conductivity type in the first wide bandgap semiconductor layer; forming a second wide bandgap semiconductor layer of the second conductivity type on a surface on the first side of the first wide bandgap semiconductor layer, the second wide bandgap semiconductor layer containing a semiconductor material having a bandgap wider than that of silicon; selectively forming a source region of the first conductivity type in the second wide bandgap semiconductor layer; forming a breakdown voltage structure region of the second conductivity type in an outer periphery of an active region including the source region and a trench; forming the trench in contact with the source region and penetrating the second wide bandgap semiconductor layer and reaching the first wide bandgap semiconductor layer; forming a gate electrode in the trench, via a gate insulating film; forming an interlayer insulating film on the gate electrode; forming a source electrode contacting the second wide bandgap semiconductor layer and the source region; and forming a drain electrode on a rear surface of the wide bandgap semiconductor substrate. The breakdown voltage structure region is formed so that a distance between the first base region and the front surface of the wide bandgap semiconductor substrate is smaller than a distance between the breakdown voltage structure region and the front surface of the wide bandgap semiconductor substrate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 13 is a table of breakdown voltages of the example and the comparison examples of the silicon carbide semiconductor device according to the embodiment.

DETAILED DESCRIPTION OF THE INVENTION

Figure 1:
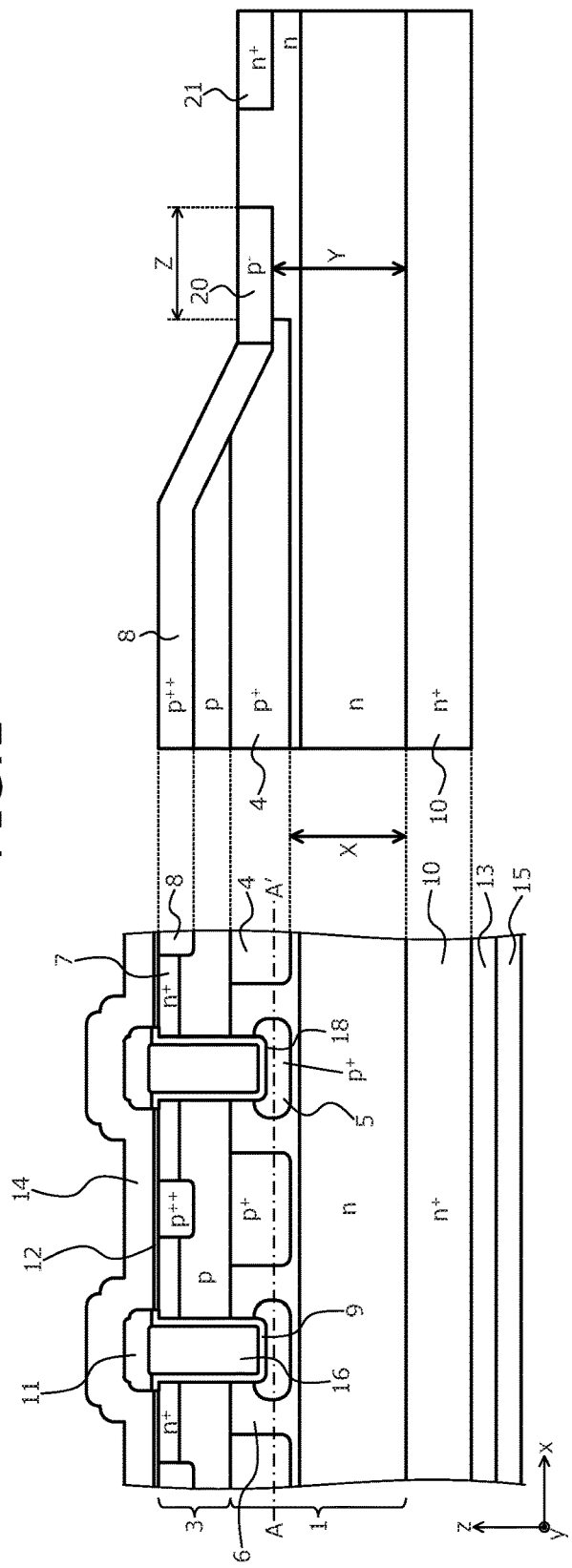
FIG. 1 is a cross-sectional view of a configuration of a silicon carbide semiconductor device according to an embodiment.

First, problems associated with the related arts will be described. When the technique described in Japanese Patent No. 5539931 is used and a pn junction is formed, manufacturing is extremely difficult because the breakdown voltage cannot be secured unless the pn junction is formed at a position deeper than the bottom of the trench or at a position near the trench. Further, when the technique described in U.S. Pat. No. 6,180,958 is used and a p-type region is formed, high electric field is likely to be applied to the gate insulating film at sidewalls of the trench and in an ON state, the current path narrows, increasing the ON resistance. Further, when the technique described in Japanese Laid-Open Patent Publication No. 2009-260253 is used and both a deep p-structure at a position separated from the trench and a p-type region at the bottom of the trench are formed, a width of a p-region at a lower part of the trench is made narrower than a width of the trench to reduce the ON resistance and therefore, high electric field applied to a corner part of the bottom of the trench is not mitigated. Furthermore, in Japanese Laid-Open Patent Publication No. 2009-260253, since the pn junction is formed widely in a region directly beneath (drain side of) the trench, the breakdown voltage of an active area increases close to a performance limit of a wide bandgap semiconductor material. As a result, the breakdown voltage of the active area easily becomes the breakdown voltage of a breakdown voltage structure area or higher, leading to reduced element capability.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to an embodiment of the present invention contains a wide bandgap semiconductor material. In the embodiment, a MOSFET will be taken as an example to describe a silicon carbide semiconductor device fabricated using, for example, silicon carbide (SiC) as a wide bandgap semiconductor material. FIG. 1 is a cross-sectional view of a configuration of the silicon carbide semiconductor device according to the embodiment.

FIG. 1 not only depicts an active region through which main current flows in a substrate thickness direction when an element structure is formed and is in an ON state, but also a configuration of an edge termination region surrounding a periphery of the active region and sustaining the breakdown voltage. In FIG. 1, a part where an element structure such as a trench 18 is formed is the active region and a part where no element structure such as the trench 18 is provided is the edge termination region. First, the active region will be described.

As depicted in FIG. 1, in the silicon carbide semiconductor device according to the embodiment, an n-type silicon carbide epitaxial layer (first wide bandgap semiconductor layer of a first conductivity type) 1 is deposited on a first main surface (front surface), for example, (0001) plane (Si face), of an n$^+$-type silicon carbide substrate (wide bandgap semiconductor substrate of the first conductivity type) 10.

The n$^+$-type silicon carbide substrate 10 is a silicon carbide single crystal substrate doped with, for example, nitrogen (N). The n-type silicon carbide epitaxial layer 1 is a low-concentration n-type drift layer doped with, for example, nitrogen and has an impurity concentration lower than an impurity concentration of the n$^+$-type silicon carbide substrate 10. An n-type high-concentration region 6 is formed in the n-type silicon carbide epitaxial layer 1, at a first side of the n-type silicon carbide epitaxial layer 1 opposite a second side of the n-type silicon carbide epitaxial layer 1 facing the n$^+$-type silicon carbide substrate 10. An impurity concentration of the n-type high-concentration region 6 is lower than the impurity concentration of the n$^+$-type silicon carbide substrate 10 and higher than the impurity concentration of the n-type silicon carbide epitaxial layer 1. The n-type high-concentration region 6 is a high-concentration n-type drift layer doped with, for example, nitrogen. Hereinafter, the n$^+$-type silicon carbide substrate 10, the n-type silicon carbide epitaxial layer 1, and a p-type silicon carbide epitaxial layer (second wide bandgap semiconductor layer of a second conductivity type) 3 described hereinafter, combined constitute a silicon carbide semiconductor base.

As depicted in FIG. 1, a rear electrode 13 is provided on a second main surface (rear surface, i.e., rear surface of the silicon carbide semiconductor base) of the n$^+$-type silicon carbide substrate 10. The rear electrode 13 constitutes a drain electrode. A drain electrode pad 15 is provided on a surface of the rear electrode 13.

A trench structure is formed on a first main surface side (side having the p-type silicon carbide epitaxial layer 3) of the silicon carbide semiconductor base. In particular, the trench 18 is formed to penetrate the p-type silicon carbide epitaxial layer 3 from a surface of the p-type silicon carbide epitaxial layer 3 on a first side (the first main surface side of the silicon carbide semiconductor base) of the p-type silicon carbide epitaxial layer 3 and reach the n-type silicon carbide epitaxial layer 1. The first side of the p-type silicon carbide epitaxial layer 3 is opposite a second side of the p-type silicon carbide epitaxial layer 3, the second side of the p-type silicon carbide epitaxial layer 3 facing the n$^+$-type silicon carbide substrate 10. Along an inner wall of the trench 18, a gate insulating film 9 is formed at side walls and a bottom of the trench 18. A gate electrode 16 is formed on the gate insulating film 9 in the trench 18. The gate electrode 16 is insulated from the n-type silicon carbide epitaxial layer 1 and the p-type silicon carbide epitaxial layer 3 by the gate insulating film 9. A part of the gate electrode 16 may protrude from a top of the trench 18 (side facing a source electrode pad 14) toward the source electrode pad 14.

In a surface layer at a first side (the first main surface side of the silicon carbide semiconductor base) of the n-type silicon carbide epitaxial layer 1 opposite the second side thereof facing the n$^+$-type silicon carbide substrate 10, a first p$^+$-type base region (first base region of the second conductivity type) 4 and a second p$^+$-type base region (second base region of the second conductivity type) 5 are selectively formed. The second p$^+$-type base region 5 is formed directly under the trench 18, and a width of the second p$^+$-type base region 5 is wider than a width of the trench 18. The first p$^+$-type base region 4 and the second p$^+$-type base region 5 are doped with, for example, aluminum (Al).

Figure 2:
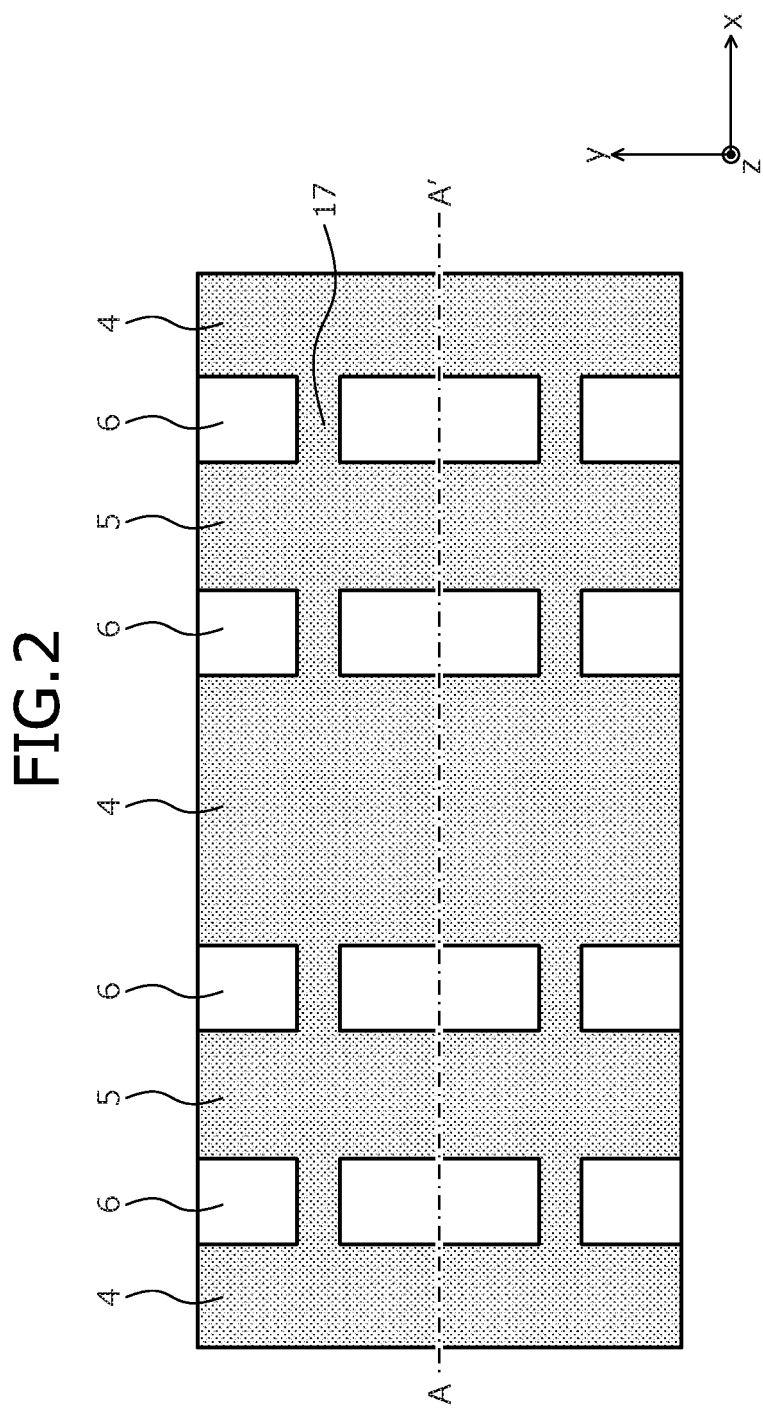
FIG. 2 is a top view of the silicon carbide semiconductor device according to the embodiment, at cutting line A-A' in FIG. 1.

Configuration may be such that a part of the first p$^+$-type base region 4 extends toward the trench 18 to be connected to the second p$^+$-type base region 5. In this case, a planar layout of the part of the first p$^+$-type base region 4 may be such that the part is repeatedly arranged alternately with the n-type high-concentration region 6, along a second direction y orthogonal to a first direction x along which the first p$^+$-type base region 4 and the second p$^+$-type base region 5 are arranged. An example of a planar layout of the first and second p$^+$-type base regions 4, 5 is depicted in FIG. 2. FIG. 2 is a top view of the silicon carbide semiconductor device according to the embodiment, at cutting line A-A' in FIG. 1.

In FIG. 2, the first and second p$^+$-type base regions 4, 5 are depicted in a state of being connected by a part 17 of the first p$^+$-type base region 4 (hatched part). For example, as depicted in FIG. 2, configuration may be such that the part 17 of the first p$^+$-type base region 4 extends along the first direction x, toward the trenches 18 on both sides of the first p$^+$-type base region 4, to be connected with a part of the second p$^+$-type base region 5 and is arranged periodically along the second direction y. A reason for this is that holes generated when avalanche breakdown occurs at a junction part of the second p$^+$-type base region 5 and the n-type silicon carbide epitaxial layer 1 are efficiently migrated to the source electrode 12, whereby load on the gate insulating film 9 is reduced and reliability is improved.

The p-type silicon carbide epitaxial layer 3 is provided on the first side of the n-type silicon carbide epitaxial layer 1. At the first side of the p-type silicon carbide epitaxial layer 3, an n$^+$-type source region (source region of the first conductivity type) 7 and a p$^{++}$-type contact region 8 are selectively provided in the p-type silicon carbide epitaxial layer 3. The n$^+$-type source region 7 is in contact with the trench 18. Further, the n$^+$-type source region 7 and the p$^{++}$-type contact region 8 are in contact with each other. In the surface layer of the n-type silicon carbide epitaxial layer 1, at the first side thereof, the n-type high-concentration region 6 is provided in a region between the first p$^+$-type base region 4 and the second p$^+$-type base region 5, and in a region between the p-type silicon carbide epitaxial layer 3 and the second p$^+$-type base region 5.

In FIG. 1, although only two trench MOS structures are depicted, further MOS gate (insulated gates using a metal oxide semiconductor material) structures of a trench structure may be arranged in parallel.

On the entire first main surface side of the silicon carbide semiconductor base, an interlayer insulating film 11 is provided so as to cover the gate electrode 16 embedded in the trench 18. A source electrode 12 is in contact with an n$^+$-type source region 7 and a p$^{++}$-type contact region 8, via a contact hole opened in the interlayer insulating film 11. The source electrode 12 is electrically insulated from the gate electrode 16 by the interlayer insulating film 11. The source electrode pad 14 is provided on the source electrode 12.

The edge termination region will be described. In the edge termination region, the p-type silicon carbide epitaxial layer 3 is removed from the edge termination region entirely, forming at a front surface of the silicon carbide semiconductor base, a step where the edge termination region is lower than the active region (recessed toward the drain side), and the n-type silicon carbide epitaxial layer 1 is exposed at a bottom of the step. Further, in the edge termination region, a breakdown voltage structure region 20 having a ring-shape and low impurity concentration is provided to mitigate electric field. Outside (toward a chip edge of) the breakdown voltage structure region 20, an n$^+$-type semiconductor region 21 is provided to function as a channel stopper. Further, a part of the breakdown voltage structure region 20 may be provided on the first p$^+$-type base region 4. The p$^{++}$-type contact region 8 covers a step part and an end of the p$^{++}$-type contact region 8 is in the first p$^+$-type base region 4. The p$^{++}$-type contact region 8 covers the step part thereby improving passage of holes through the breakdown voltage structure area and enabling increased avalanche capability. Further, when the end of the p$^{++}$-type contact region 8 exceeds the first p$^+$-type base region 4, although the breakdown voltage structure area has to be increased, reducing the area of the active region, since the end is in the first p$^+$-type base region 4, a need to further increase the breakdown voltage structure area is eliminated.

Here, in the embodiment, configuration is such that a distance X of the first p$^+$-type base region 4 with respect to a first main surface of the n$^+$-type silicon carbide substrate 10 is smaller than a distance Y of the breakdown voltage structure region 20 with respect to the first main surface of the n$^+$-type silicon carbide substrate 10 (X<Y). Since the first p$^+$-type base region 4 and the breakdown voltage structure region 20 are formed by Al$^+$ ion implantation, this configuration may be realized by adjustment of acceleration energy at the time of the Al$^+$ ion implantation. Further, this configuration may also be formed by leaving only a certain film thickness without completely removing a mask oxide film of an ion implantation region.

An impurity concentration of the breakdown voltage structure region 20 may be $1.0 \times 10^{17}/cm^3$ or higher, and a distance Z that the breakdown voltage structure region 20 extends beyond the first p$^+$-type base region 4 may be 5.0 μm or more. Such a design enables a concentration of electric field at an end of the first p$^+$-type base region 4 to be prevented, and by further increasing the impurity concentration of the breakdown voltage structure region 20, an effect is obtained in that the amount of holes flowing is suppressed, increasing breakdown capability.

A method of manufacturing the silicon carbide semiconductor device according to the embodiment will be described. FIGS. 3, 4, 5, 6, 7, 8, 9, 10, 11, and 12 are cross-sectional views of the silicon carbide semiconductor device according to the embodiment during manufacture.

First, the n$^+$-type silicon carbide substrate 10 containing an n-type silicon carbide is prepared. Then, on the first main surface of the n$^+$-type silicon carbide substrate 10, a first n-type silicon carbide epitaxial layer 1a containing silicon carbide is formed by formed by epitaxial growth to have a thickness of, for example, about 10 μm while an n-type impurity, for example, nitrogen atoms, is doped. The first n-type silicon carbide epitaxial layer 1a constitutes the n-type silicon carbide epitaxial layer 1. The first n-type silicon carbide epitaxial layer 1a may be formed so that an impurity concentration thereof is about $3 \times 10^{15}/cm^3$.

Figure 3:
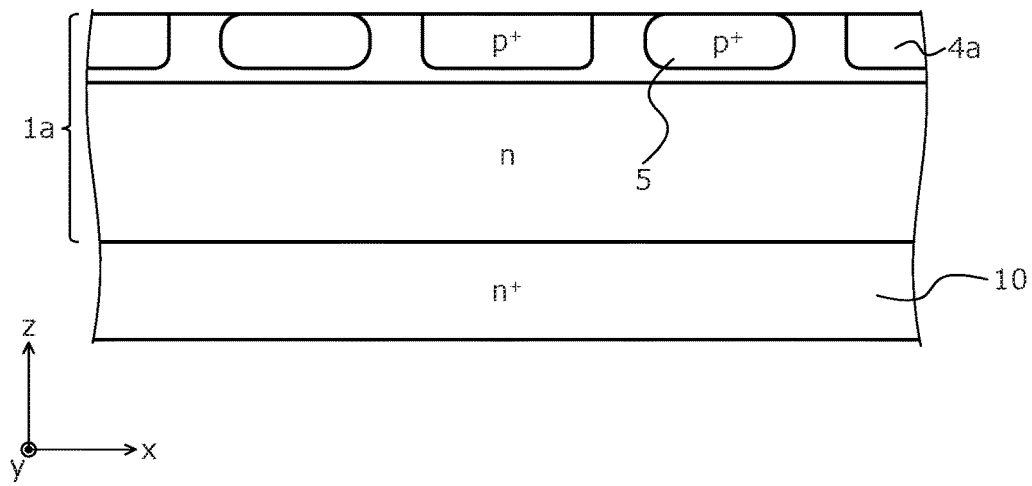
FIG. 3 is a cross-sectional view of the silicon carbide semiconductor device according to the embodiment during manufacture.

Next, on a surface of the first n-type silicon carbide epitaxial layer 1a, a silicon oxide (SiO$_2$) film is deposited to a thickness of 1.5 μm by a method such as plasma chemical vapor deposition (CVD), and an ion implantation mask having predetermined openings is formed by photolithography. Then, a p-type impurity such as aluminum is implanted in the openings of the silicon oxide film, forming a lower first p$^+$-type base region 4a at a depth of about 0.5 μm. Concurrently with the lower first p$^+$-type base region 4a, the second p$^+$-type base region 5 constituting the bottom of the trench 18 may be formed. An impurity concentration of the lower first p$^+$-type base region 4a and the second p$^+$-type base region 5 is set to be, for example, about $5 \times 10^{18}/cm^3$. The state up to here is depicted in FIG. 3.

Next, a part of the ion implantation mask is removed, an n-type impurity such as nitrogen is ion implanted in the openings, forming in a part of a surface region of the first n-type silicon carbide epitaxial layer 1a, a lower n-type high-concentration region 6a at a depth of, for example, about 0.5 μm. An impurity concentration of the lower n-type high-concentration region 6a is set to be, for example, about $1 \times 10^{17}/cm^3$.

Next, on the surface of the first n-type silicon carbide epitaxial layer 1a, a second n-type silicon carbide epitaxial layer 1b is formed to have a thickness of about 0.5 μm while an n-type impurity such as nitrogen is doped. An impurity concentration of the second n-type silicon carbide epitaxial layer 1b is set to be about $3 \times 10^{15}/cm^3$. Hereinafter, the first n-type silicon carbide epitaxial layer 1a and the second n-type silicon carbide epitaxial layer 1b combined constitute the n-type silicon carbide epitaxial layer 1.

Next, on a surface of the second n-type silicon carbide epitaxial layer 1b, a silicon oxide film is deposited to a thickness of 1.5 μm by a method such as plasma CVD, and an ion implantation mask having predetermined openings is formed by photolithography. Then, a p-type impurity such as aluminum is implanted in the openings of the silicon oxide film, forming an upper first p$^+$-type base region 4b at a depth of about 0.5 μm so as to overlap the lower first p$^+$-type base region 4a. The lower first p$^+$-type base region 4a and the upper first p$^+$-type base region 4b form a continuous region constituting the first p$^+$-type base region 4. An impurity concentration of the upper first p$^+$-type base region 4b is set to be, for example, about $5 \times 10^{18}/cm^3$.

Figure 4:
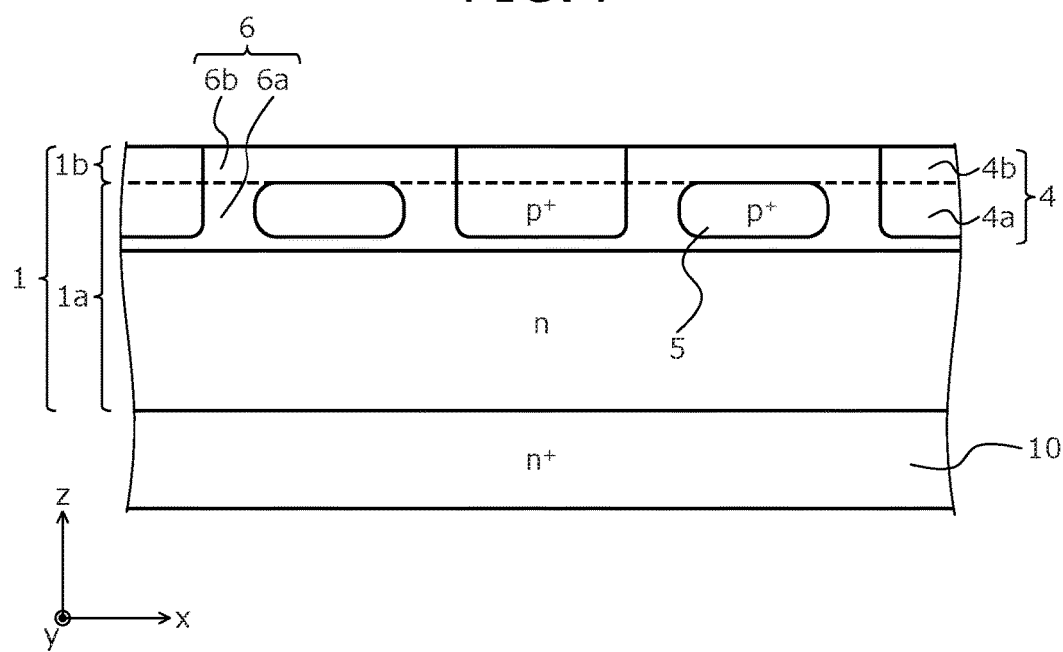
FIG. 4 is a cross-sectional view of the silicon carbide semiconductor device according to the embodiment during manufacture.

Next, a part of the ion implantation mask is removed, an n-type impurity such as nitrogen is ion implanted in the openings, forming in a surface region of the second n-type silicon carbide epitaxial layer 1b, an upper n-type high-concentration region 6b having a thickness of, for example, about 0.5 μm. An impurity concentration of the upper n-type high-concentration region 6b is set to be, for example, about $1 \times 10^{17}/cm^3$. The upper n-type high-concentration region 6b and the lower n-type high-concentration region 6a are formed to at least partially contact each other, and form the n-type high-concentration region 6. However, there are instances when the n-type high-concentration region 6 is formed at a substrate surface entirely and when the n-type high-concentration region 6 is formed at a substrate surface partially. The state up to here is depicted in FIG. 4.

Figure 5:
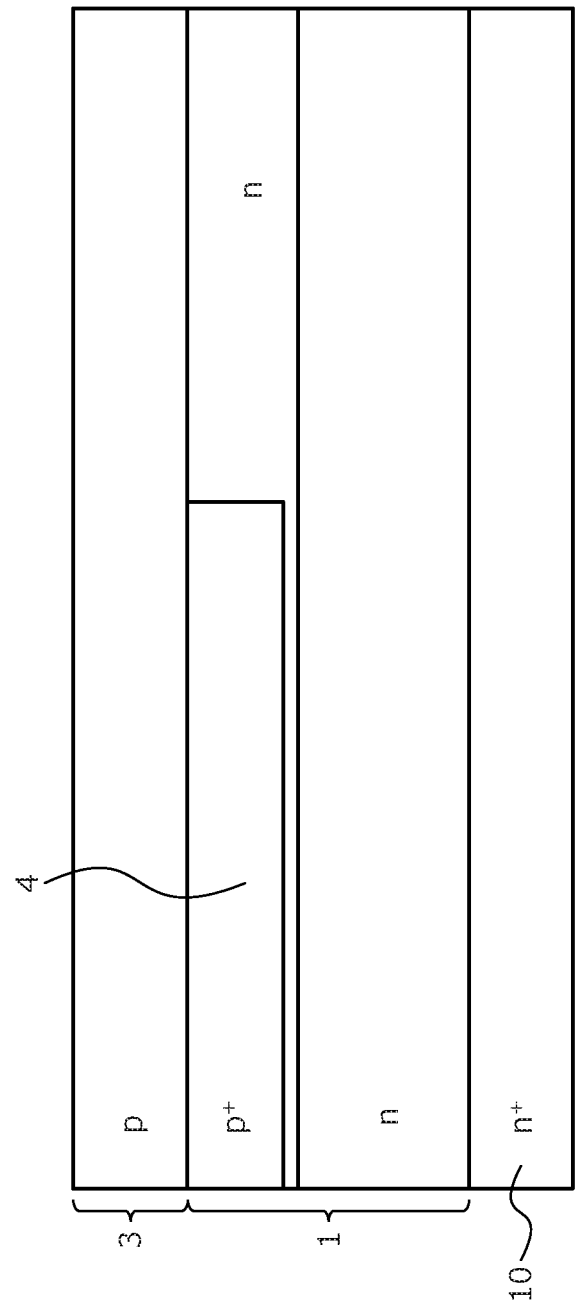
FIG. 5 is a cross-sectional view of the silicon carbide semiconductor device according to the embodiment during manufacture.

Next, on a surface of the n-type silicon carbide epitaxial layer 1, the p-type silicon carbide epitaxial layer 3 is formed to have a thickness of about 1.3 μm while a p-type impurity such as aluminum is doped. An impurity concentration of the p-type silicon carbide epitaxial layer 3 is set to be about $4 \times 10^{17}/cm^3$. The state up to here is depicted in FIG. 5. FIG. 5 depicts the edge termination region of a silicon carbide semiconductor element.

Figure 6:
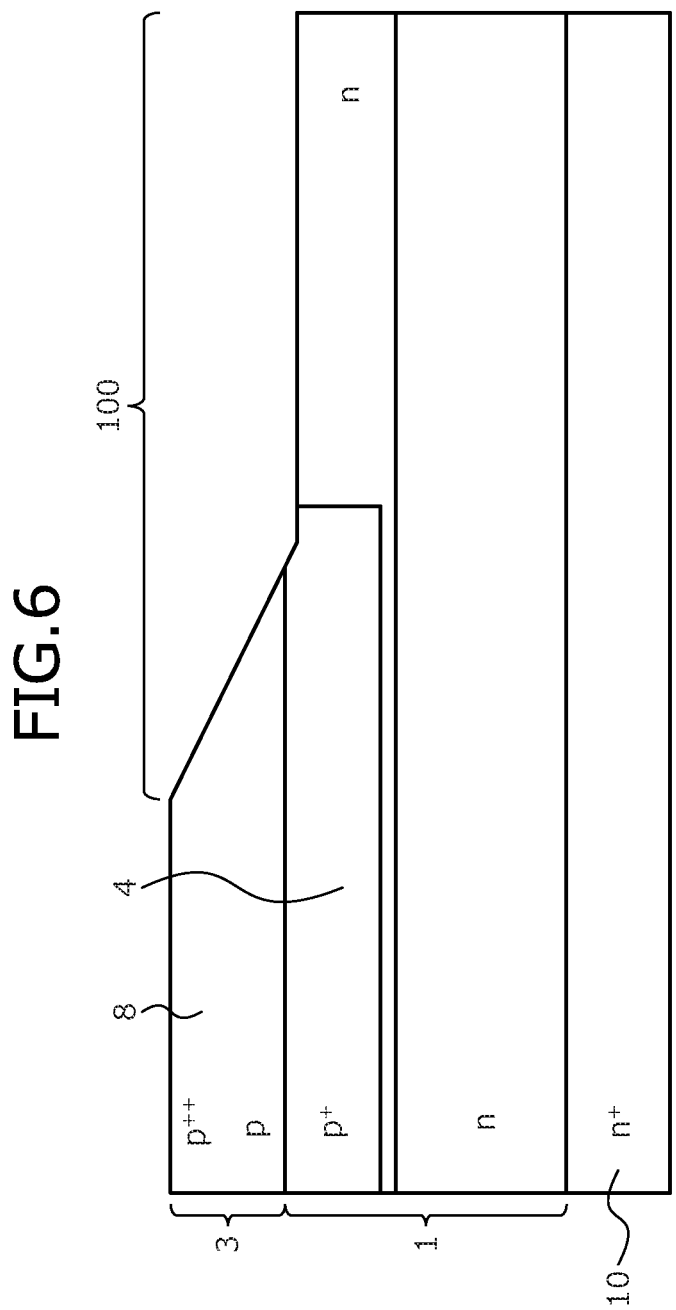
FIG. 6 is a cross-sectional view of the silicon carbide semiconductor device according to the embodiment during manufacture.

Next, on the p-type silicon carbide epitaxial layer 3, a photoresist is formed at an element center by photolithography. The photoresist is used as a mask and dry etching using a fluorine-based gas such as sulfur hexafluoride (SF$_6$) is performed, removing a periphery of the p-type silicon carbide epitaxial layer 3 to a depth of about 1.3 μm and producing a recess 100 of a first stage. A bottom of a side surface of the recess is in contact with the first p$^+$-type base region 4 formed in the n-type silicon carbide epitaxial layer 1 and at a central portion of a surface of the recess, the surface is formed substantially parallel to the n$^+$-type silicon carbide substrate 10. The state up to here is depicted in FIG. 6. FIG. 6 depicts the edge termination region of the silicon carbide semiconductor element.

Figure 7:
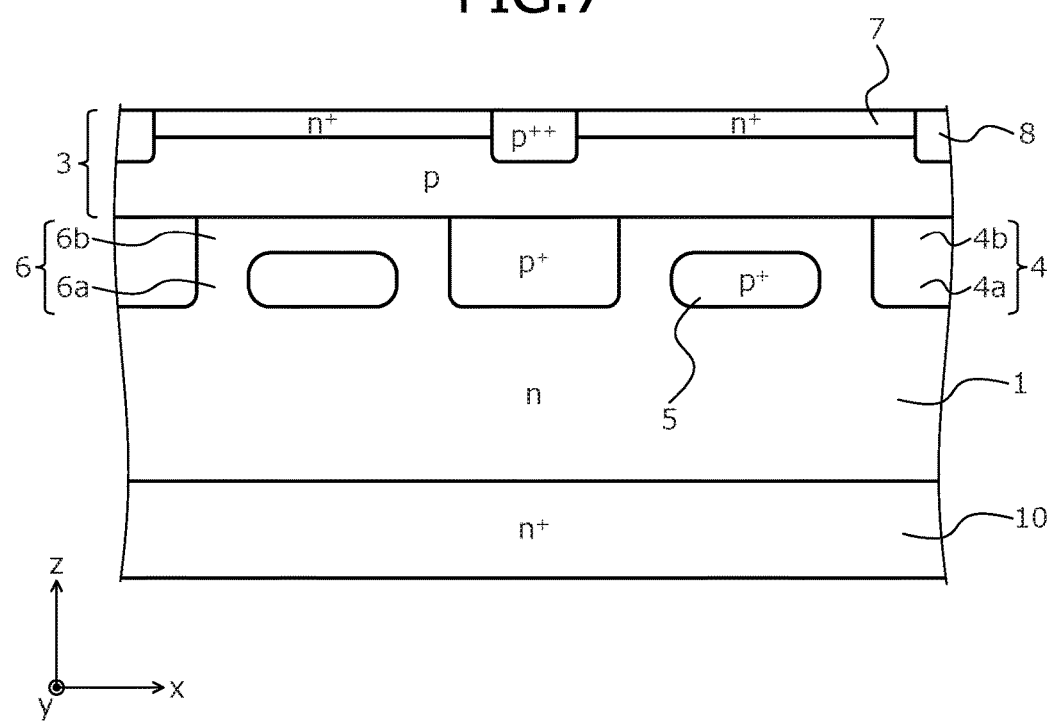
FIG. 7 is a cross-sectional view of the silicon carbide semiconductor device according to the embodiment during manufacture.

Next, on surfaces of the p-type silicon carbide epitaxial layer 3 and the exposed n-type silicon carbide epitaxial layer 1, a silicon oxide film is deposited to a thickness of 1.5 μm by a method such as plasma CVD, and an ion implantation mask having predetermined openings is formed by photolithography. An n-type impurity such as phosphorus (P) is ion implanted in the openings, forming the n$^+$-type source region 7 in a part of the surface of the p-type silicon carbide epitaxial layer 3. An impurity concentration of the n$^+$-type source region 7 is set to be higher than an impurity concentration the p-type silicon carbide epitaxial layer 3. Next, the ion implantation mask used in forming the n$^+$-type source region 7 is removed, an ion implantation mask having predetermined openings is formed by the same method above, and a p-type impurity such as aluminum is ion implanted in a part of the surface of the p-type silicon carbide epitaxial layer 3, forming the p$^{++}$-type contact region 8. An impurity concentration of the p$^{++}$-type contact region 8 is set to be higher than the impurity concentration of the p-type silicon carbide epitaxial layer 3. The state up to here is depicted in FIG. 7.

Figure 8:
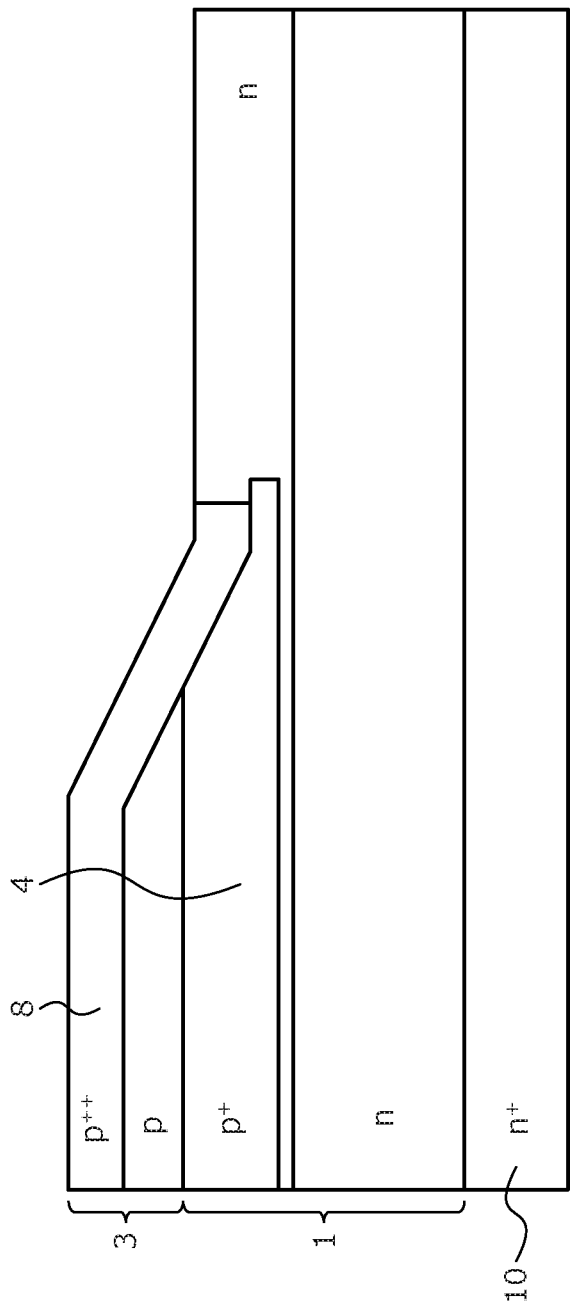
FIG. 8 is a cross-sectional view of the silicon carbide semiconductor device according to the embodiment during manufacture.

Further, as depicted in FIG. 8, a region concurrently ion implanted during formation of the p$^{++}$-type contact region 8 may be spread from a top of the active region, covering the first p$^+$-type base region 4 to a surface of the n-type silicon carbide epitaxial layer 1.

Figure 9:
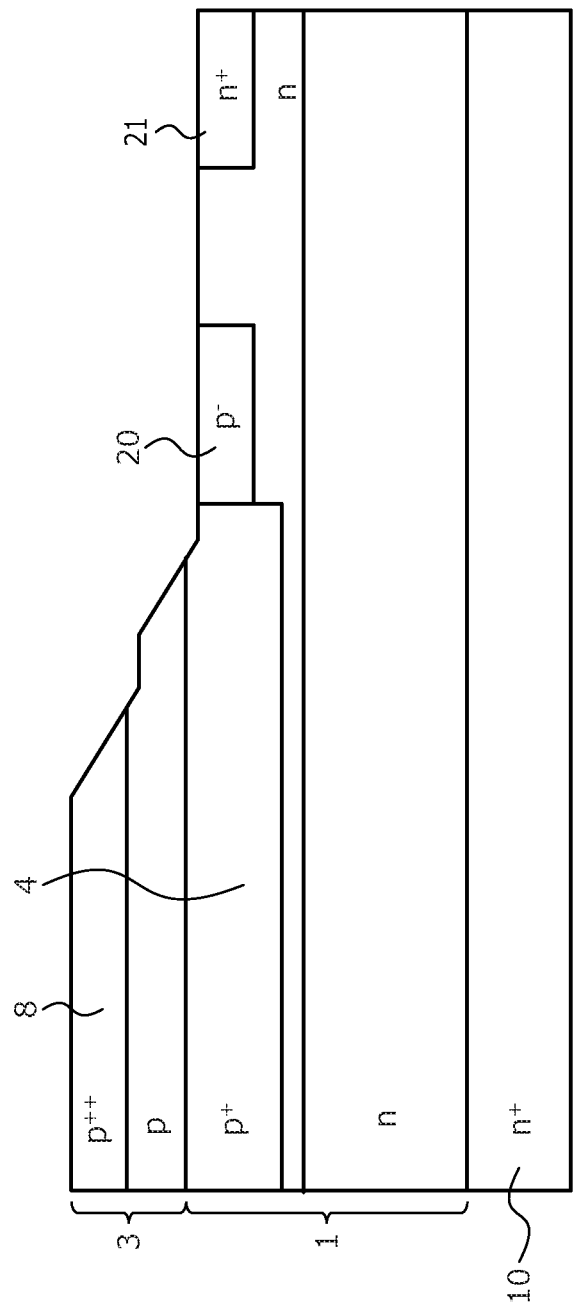
FIG. 9 is a cross-sectional view of the silicon carbide semiconductor device according to the embodiment during manufacture.
Figure 10:
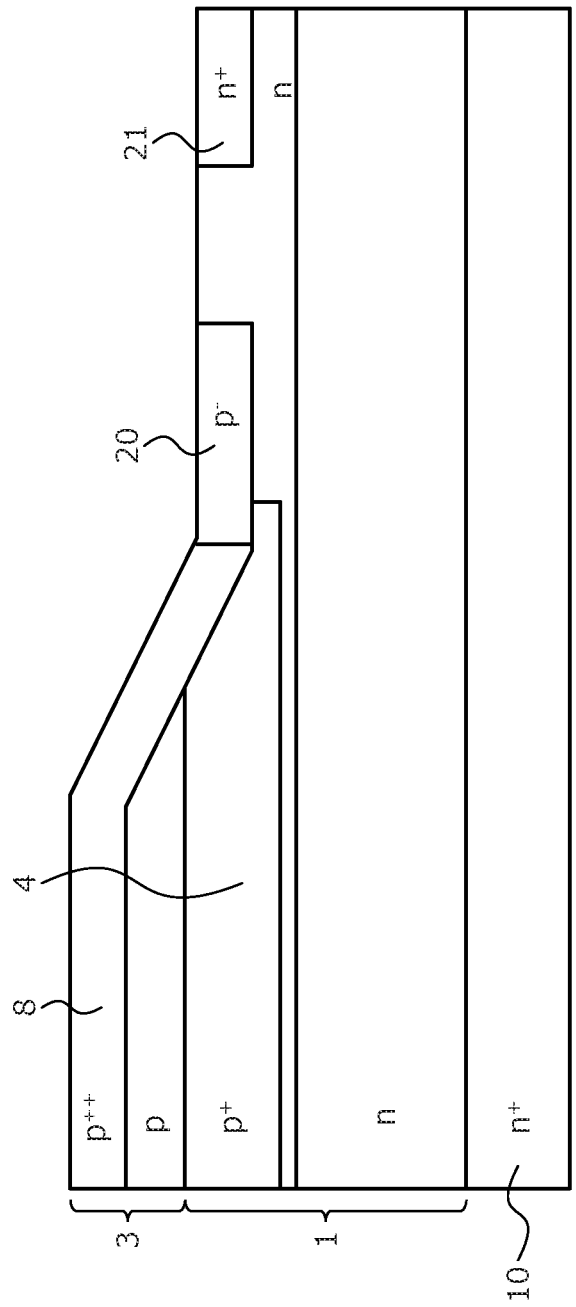
FIG. 10 is a cross-sectional view of the silicon carbide semiconductor device according to the embodiment during manufacture.

Next, on the surface of the p-type silicon carbide epitaxial layer 3 and the exposed n-type silicon carbide epitaxial layer 1, a silicon oxide film is deposited to a thickness of 1.5 μm by a method such as plasma CVD, and an ion implantation mask having predetermined openings is formed by photolithography. A p-type impurity such as aluminum is ion implanted in the openings, forming in the surface of the exposed n-type silicon carbide epitaxial layer 1, the breakdown voltage structure region 20 having a low impurity concentration. An ion implantation mask having predetermined openings is formed by the same method above, and an n-type impurity is ion implanted in a part of the surface of the n-type silicon carbide epitaxial layer 1, forming the n$^+$-type semiconductor region 21. The state up to here is depicted in FIG. 9. Further, the breakdown voltage structure region 20 may be a structure formed in a region from an end of the first p$^+$-type base region 4 to outside an element, or a structure formed in a region from the side surface of the recess to outside the element as depicted in FIG. 10.

Figure 11:
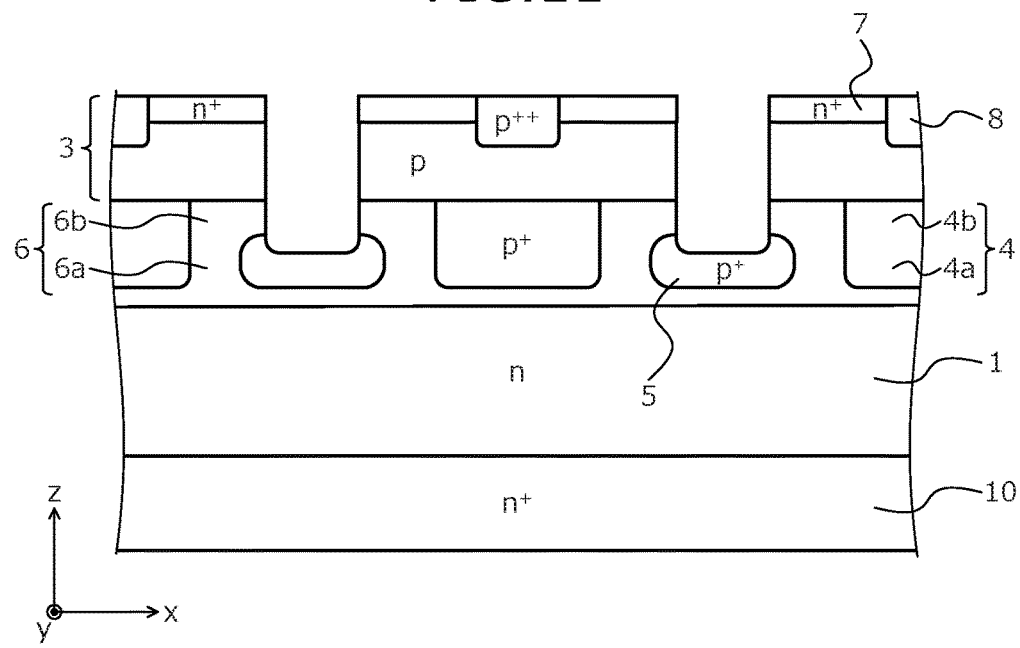
FIG. 11 is a cross-sectional view of the silicon carbide semiconductor device according to the embodiment during manufacture.
Figure 12:
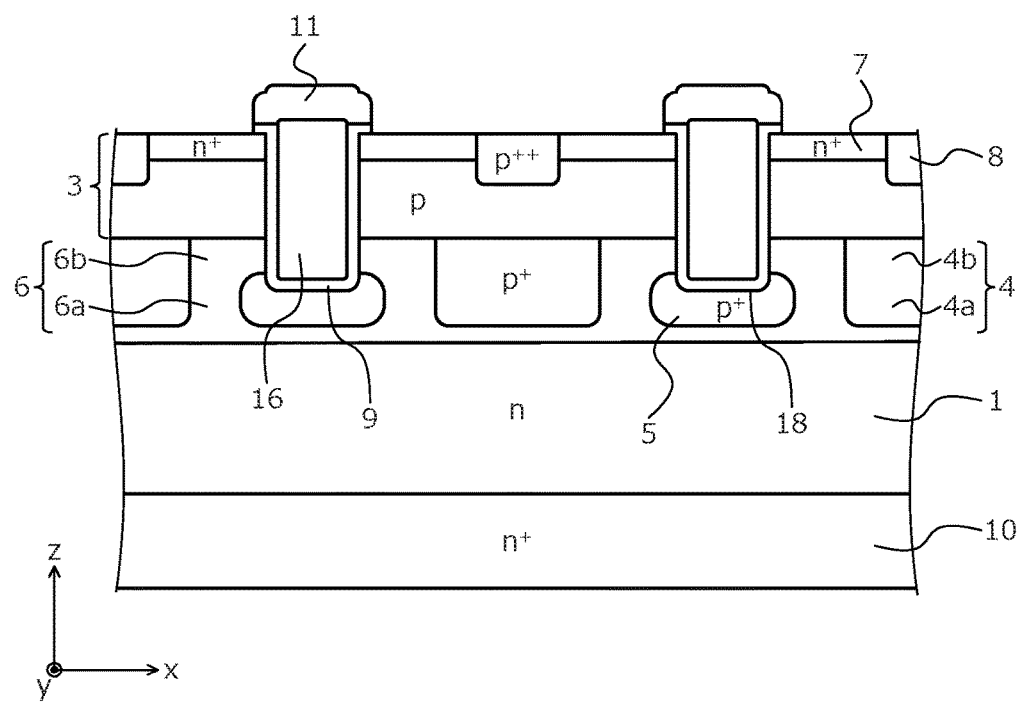
FIG. 12 is a cross-sectional view of the silicon carbide semiconductor device according to the embodiment during manufacture.

Next, heat treatment is performed in an inert gas atmosphere at a temperature of about 1700 degrees C., and an activation process for the first p$^+$-type base region 4, the second p$^+$-type base region 5, the n$^+$-type source region 7, and the p$^{++}$-type contact region 8 is performed. Thereafter, on the surfaces of the p-type silicon carbide epitaxial layer 3 and the exposed n-type silicon carbide epitaxial layer 1, a silicon oxide film is deposited to a thickness of 1.5 μm by a method such as plasma CVD, and a mask for trench formation and having predetermined openings is fabricated by photolithography. Next, by dry etching, the trenches 18 are formed penetrating the p-type silicon carbide epitaxial layer 3 and reaching the n-type silicon carbide epitaxial layer 1. The bottom of the trenches 18 may reach the first p$^+$-type base region 4 formed in the n-type silicon carbide epitaxial layer 1. Next, the mask for trench formation is removed. The state up to here is depicted in FIG. 11.

Next, an oxide film is formed at the bottom and sides of the trench 18, along surfaces of the trench 18, the n$^+$-type source region 7, the p$^{++}$-type contact region 8. The oxide film may be formed by thermal oxidation by heat treatment at a temperature of about 1000 degrees C. in an oxygen atmosphere. Further, the oxide film may be deposited by plasma CVD, a vapor deposition method such as for high temperature oxide (HTO), etc.

Next, on the gate insulating film 9, a polycrystalline silicon layer doped with, for example, phosphorus atoms is formed. The polycrystalline silicon layer may be formed to be embedded in the trench 18. The polycrystalline silicon layer is patterned by photolithography so as to remain in the trench 18, whereby the gate electrode 16 is formed. A part of the gate electrode 16 may protrude outside the trench 18.

Next, so as to cover the gate insulating film 9 and the gate electrode 16, for example, phosphorus glass is deposited to a thickness of about 1 μm, forming the interlayer insulating film 11. The interlayer insulating film 11 and the gate insulating film 9 are patterned by photolithography, forming a contact hole exposing the n$^+$-type source region 7 and the p$^{++}$-type contact region 8. Thereafter, heat treatment (reflow) is performed to planarize the interlayer insulating film 11.

Next, in the contact hole and on the interlayer insulating film 11, a conductive film, such as a nickel (Ni) film, constituting the source electrode 12 is formed. The conductive film is patterned by photolithography so that the source electrode 12 remains only in the contact hole.

Next, the rear electrode 13 containing nickel, etc. is formed on the second main surface of the n$^+$-type silicon carbide substrate 10. Thereafter, heat treatment is performed at a temperature of 1000 degrees C. in an inert gas atmosphere, forming the source electrode 12 and the rear electrode 13 in ohmic contact with the n$^+$-type source region 7, the p$^{++}$-type contact region 8, and the n$^+$-type silicon carbide substrate 10.

Next, on the first main surface of the n$^+$-type silicon carbide substrate 10, an aluminum film is deposited to a thickness of about 5 μm by a sputtering technique, and the aluminum film is removed by photolithography so as to cover the source electrode 12 and the interlayer insulating film 11, thereby forming the source electrode pad 14.

Next, on a surface of the rear electrode 13, for example, titanium (Ti), nickel, and gold (Au) are stacked in stated order, whereby the drain electrode pad 15 is formed. Thus, the semiconductor device depicted in FIGS. 1 and 2 is completed.

As described, in the semiconductor device according to the embodiment, the distance of the first p$^+$-type base region from the first main surface of the n$^+$-type silicon carbide substrate is less than the distance of the breakdown voltage structure region from the first main surface of the n$^+$-type silicon carbide substrate. As a result, breakdown voltage of the active area may be suppressed and breakdown voltage design of the breakdown voltage structure area is facilitated, enabling a structure that suppresses decreases in breakdown voltage.

For the semiconductor device of the embodiment, a verification experiment was performed with respect to the distance X of the first p$^+$-type base region 4 from the first main surface of the n$^+$-type silicon carbide substrate 10 and the distance Y of the (low impurity concentration) breakdown voltage structure region 20 from the first main surface of the n$^+$-type silicon carbide substrate 10.

In an example, a structure was fabricated in which the distance X of the first p$^+$-type base region 4 from the first main surface of the n$^+$-type silicon carbide substrate 10 was less than the distance Y of the (low impurity concentration) breakdown voltage structure region 20 from the first main surface of the n$^+$-type silicon carbide substrate 10 (X<Y). A thickness of the first p$^+$-type base region 4 may be 0.2 μm to 1.0 μm and in the example, was 0.5 μm. A thickness of the breakdown voltage structure region 20 may be 0.1 μm to 0.8 μm and the example, was 0.4 μm. Y-X may be 0.1 μm to 0.9 μm and in the example, was 0.3 μm.

Further, as a first comparison example, a structure was fabricated in which the distance X of the first p$^+$-type base region 4 from the first main surface of the n$^+$-type silicon carbide substrate 10 was equal to the distance Y of the (low impurity concentration) breakdown voltage structure region 20 from the first main surface of the n$^+$-type silicon carbide substrate 10 (X=Y). An adjustment method for the distance X and the distance Y was the method of the embodiment.

Further, as a second comparison example, a structure was fabricated in which the distance X of the first p$^+$-type base region 4 from the first main surface of the n$^+$-type silicon carbide substrate 10 was more than the distance Y of the (low impurity concentration) breakdown voltage structure region 20 from the first main surface of the n$^+$-type silicon carbide substrate 10 (X>Y). An adjustment method for the distance X and the distance Y was the method of the embodiment.

Various characteristics verification of the devices fabricated by the methods described above were performed. For breakdown voltage characteristics, in a case where the example, the first comparison example, and the second comparison example have identical breakdown voltage structure regions 20 and the active area is a PN diode, elements were fabricated and measured on a single wafer.

FIG. 13 is a table of breakdown voltages of the example and the comparison examples of the silicon carbide semiconductor device according to the embodiment. It was confirmed that when the breakdown voltage of the PN diode is about 1700V, in the example, the active area was destroyed at 1500V.

Further, for the first comparison example and the second comparison example, breakdown voltage (1700V) equal to the PN diode was confirmed, and the destroyed location was the breakdown voltage structure area. Therefore, in the first comparison example and the second comparison example, the breakdown voltage of the active area was higher than that of the breakdown voltage structure area. Further, the breakdown voltage structure area has a smaller area that causes avalanche breakdown than the active area and therefore, when destruction occurs at breakdown voltage structure area, avalanche breakdown capability is lower than when destruction occurs in the active area. From the results above, it was found that the first comparison example and the second comparison example have a small avalanche breakdown capability as compared to the example.

From the verification results, it was confirmed that in the silicon carbide semiconductor device of the embodiment, suppression of the breakdown voltage of the active area facilitates breakdown voltage design of the breakdown voltage structure area and enables a wide bandgap semiconductor device having a structure that suppresses decreases in breakdown voltage to be provided.

In the embodiment of the present invention, although, as an example, a main surface of a silicon carbide substrate containing silicon carbide is a (0001) plane and on the (0001) plane, a MOS is configured, without limitation hereto, various modifications are possible such as the orientation of the main surface of the wide bandgap semiconductor substrate.

Further, in the embodiment of the present invention, although the first conductivity type is assumed to be an n type and the second conductivity type is assumed to be a p-type, the present invention is similarly implemented when the first conductivity type is a p-type and the second conductivity type is an n-type.

According to the embodiments of the present invention, the distance of the first p$^+$-type base region (first base region of the second conductivity type) from the first main surface of the n$^+$-type silicon carbide substrate (wide bandgap semiconductor substrate of the first conductivity type) is smaller than the distance of the breakdown voltage structure region from the first main surface of the n$^+$-type silicon carbide substrate. As a result, the breakdown voltage of the active area may be suppressed, facilitating breakdown voltage design of the breakdown voltage structure area and enabling a structure that suppresses decreases in breakdown voltage.

The semiconductor device and the method of manufacturing a semiconductor device of the embodiments of the present invention achieve effects in that easy manufacturing is enabled, the electric field strength at the gate insulating film at the bottom of the trench is mitigated, and the breakdown voltage of the active area is suppressed, whereby breakdown voltage design of the breakdown voltage structure area is facilitated and decreases in breakdown voltage may be suppressed.

As described, the semiconductor device according to the present invention is useful for high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region and a breakdown voltage structure region, comprising:
   a wide bandgap semiconductor substrate of a first conductivity type and containing a semiconductor material having a bandgap wider than that of silicon, the wide bandgap semiconductor substrate having a front surface and a rear surface;
   a first wide bandgap semiconductor layer of the first conductivity type provided on the front surface of the wide bandgap semiconductor substrate, the first wide bandgap semiconductor layer containing the semiconductor material having a bandgap wider than that of silicon, an impurity concentration of the first wide bandgap semiconductor layer being lower than an impurity concentration of the wide bandgap semiconductor substrate;
   a first base region of a second conductivity type selectively provided in a surface layer on a first side of the first wide bandgap semiconductor layer opposite to a second side of the first wide bandgap semiconductor layer facing the wide bandgap semiconductor substrate;
   a second base region of the second conductivity type selectively provided in the first wide bandgap semiconductor layer;
   a second wide bandgap semiconductor layer of the second conductivity type provided on a surface on the first side of the first wide bandgap semiconductor layer, the second wide bandgap semiconductor layer containing the semiconductor material having a bandgap wider than that of silicon;

a source region of the first conductivity type selectively provided in the second wide bandgap semiconductor layer;

a gate electrode provided in a trench, via a gate insulating film, the trench being in contact with the source region, penetrating the second wide bandgap semiconductor layer and reaching the first wide bandgap semiconductor layer;

an interlayer insulating film provided on the gate electrode;

a source electrode in contact with the source region and the second wide bandgap semiconductor layer; and a drain electrode provided on the rear surface of the wide bandgap semiconductor substrate, wherein the active region is a region through which a main current flows between the source electrode and the drain electrode, the breakdown voltage structure region is of the second conductivity type, and provided in an outer periphery of the active region, and in a depth direction, a first distance between a bottom of the first base region and the front surface of the wide bandgap semiconductor substrate is smaller than a bottom of a second distance between the breakdown voltage structure region and the front surface of the wide bandgap semiconductor substrate.

2. The semiconductor device according to claim 1, wherein a part of the breakdown voltage structure region is provided above the first base region in plan view.

3. The semiconductor device according to claim 2, wherein an impurity concentration of the breakdown voltage structure region is at least $1.0 \times 10^{17}/cm^3$, and the breakdown voltage structure region extends until at least 5.0 μm farther than an outermost periphery of the first base region in the plan view.

4. The semiconductor device according to claim 1, wherein the semiconductor material having a bandgap wider than that of silicon is silicon carbide.

* * * * *